(12) United States Patent
Cheah et al.

(10) Patent No.: US 11,177,226 B2
(45) Date of Patent: Nov. 16, 2021

(54) FLEXIBLE SHIELD FOR SEMICONDUCTOR DEVICES

(71) Applicant: Intel Corporation, Santa Clara, CA (US)

(72) Inventors: Bok Eng Cheah, Bukit Gambir (MY); Eng Huat Goh, Penang (MY); Jackson Chung Peng Kong, Tanjung Tokong (MY); Khang Choong Yong, Puchong (MY); Min Suet Lim, Simpang Ampat (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/450,266

(22) Filed: Jun. 24, 2019

(65) Prior Publication Data

US 2020/0091093 A1    Mar. 19, 2020

(30) Foreign Application Priority Data

Sep. 19, 2018 (MY) .......................... PI 2018703362

(51) Int. Cl.
| | | |
|---|---|---|
| *H01L 23/60* | (2006.01) |
| *H01L 23/48* | (2006.01) |
| *H01L 25/07* | (2006.01) |
| *H01L 25/11* | (2006.01) |
| *H01L 25/065* | (2006.01) |

(52) U.S. Cl.
CPC ............ *H01L 23/60* (2013.01); *H01L 23/481* (2013.01); *H01L 25/0652* (2013.01); *H01L 25/0655* (2013.01); *H01L 25/071* (2013.01); *H01L 25/072* (2013.01); *H01L 25/112* (2013.01); *H01L 25/115* (2013.01); *H01L 2924/16196* (2013.01)

(58) Field of Classification Search
CPC ... H01L 23/60; H01L 23/481; H01L 25/2652; H01L 25/071; H01L 25/0753; H01L 2924/1611; H01L 2924/1615; H01L 2924/16151; H01L 2924/1715; H01L 2924/17151; H01L 25/0655; H01L 25/0652; H01L 25/072; H01L 25/112; H01L 25/115; H01L 2924/16196
See application file for complete search history.

(56) References Cited

U.S. PATENT DOCUMENTS

| | | | | |
|---|---|---|---|---|
| 6,552,910 B1* | 4/2003 | Moon | ................. | H01L 23/5387 361/749 |
| 6,590,282 B1* | 7/2003 | Wang | ................. | H01L 25/0657 257/685 |
| 7,445,968 B2* | 11/2008 | Harrison | ............. | H01L 23/3677 257/660 |

(Continued)

*Primary Examiner* — Ida M Soward
(74) *Attorney, Agent, or Firm* — Schwegman Lundberg & Woessner, P.A.

(57) ABSTRACT

An electronic device and associated methods are disclosed. In one example, the electronic device includes a first device and a second device coupled to a surface of a substrate, and a continuous flexible shield woven over the first device and under the second device to separate the first device from the second device. In selected examples, the continuous flexible shield may be formed from a laminate and one or more of the devices may be coupled through an opening or via in the continuous flexible shield.

15 Claims, 6 Drawing Sheets

(56) References Cited

U.S. PATENT DOCUMENTS

| | | | |
|---|---|---|---|
| 8,975,738 B2* | 3/2015 | Haba | H01L 25/105 |
| | | | 257/692 |
| 9,055,682 B2* | 6/2015 | Mugiya | H01L 23/552 |
| 9,793,223 B2* | 10/2017 | Yoo | H01L 21/56 |
| 9,807,916 B2* | 10/2017 | Kitazaki | H05K 9/0015 |
| 10,204,869 B2* | 2/2019 | Jeong | H01L 23/552 |
| 10,217,711 B2* | 2/2019 | Yoon | H01L 21/561 |
| 10,242,957 B2* | 3/2019 | Kim | H01L 24/17 |
| 10,685,854 B2* | 6/2020 | Hung | H01L 23/34 |
| 10,707,176 B2* | 7/2020 | Kim | B23K 26/38 |
| 10,840,191 B2* | 11/2020 | Jung | H01L 21/563 |
| 2005/0046001 A1* | 3/2005 | Warner | H01L 23/645 |
| | | | 257/678 |
| 2008/0122047 A1* | 5/2008 | Honer | H01L 27/222 |
| | | | 257/660 |
| 2013/0105950 A1* | 5/2013 | Bergemont | H01L 23/13 |
| | | | 257/659 |
| 2013/0137950 A1* | 5/2013 | Harttig | A61B 5/14532 |
| | | | 600/345 |
| 2017/0249813 A1* | 8/2017 | Busby | G08B 13/12 |
| 2018/0096967 A1* | 4/2018 | Tsai | H01L 23/552 |
| 2020/0126922 A1* | 4/2020 | Seidemann | H01L 23/49822 |
| 2020/0225332 A1* | 7/2020 | Wagner | G01S 13/865 |

\* cited by examiner

FLEXIBLE SHIELD FOR SEMICONDUCTOR DEVICES

PRIORITY APPLICATION

This application claims the benefit of priority to Malaysian Application Serial Number PI 2018703362, filed Sep. 19, 2018, which is incorporated herein by reference in its entirety.

TECHNICAL FIELD

Embodiments described herein generally relate to shielding of semiconductor devices.

BACKGROUND

Electromagnetic interference, such as radio frequency interference, poses challenges to electronic device operation. In one example, where an electronic device includes a wireless transmitter or receiver, electromagnetic interference can be a large technical challenge. High speed compact devices using protocols such as 20 Gbps Thunderbolt Gen3, 16 Gbps PCIe, Gen4, and 10 Gbps USB 3.1 Gen2 are examples devices sensitive to electromagnetic interference. It is desired to have low cost, effective device configurations that address these interference concerns, and other technical challenges.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1A:
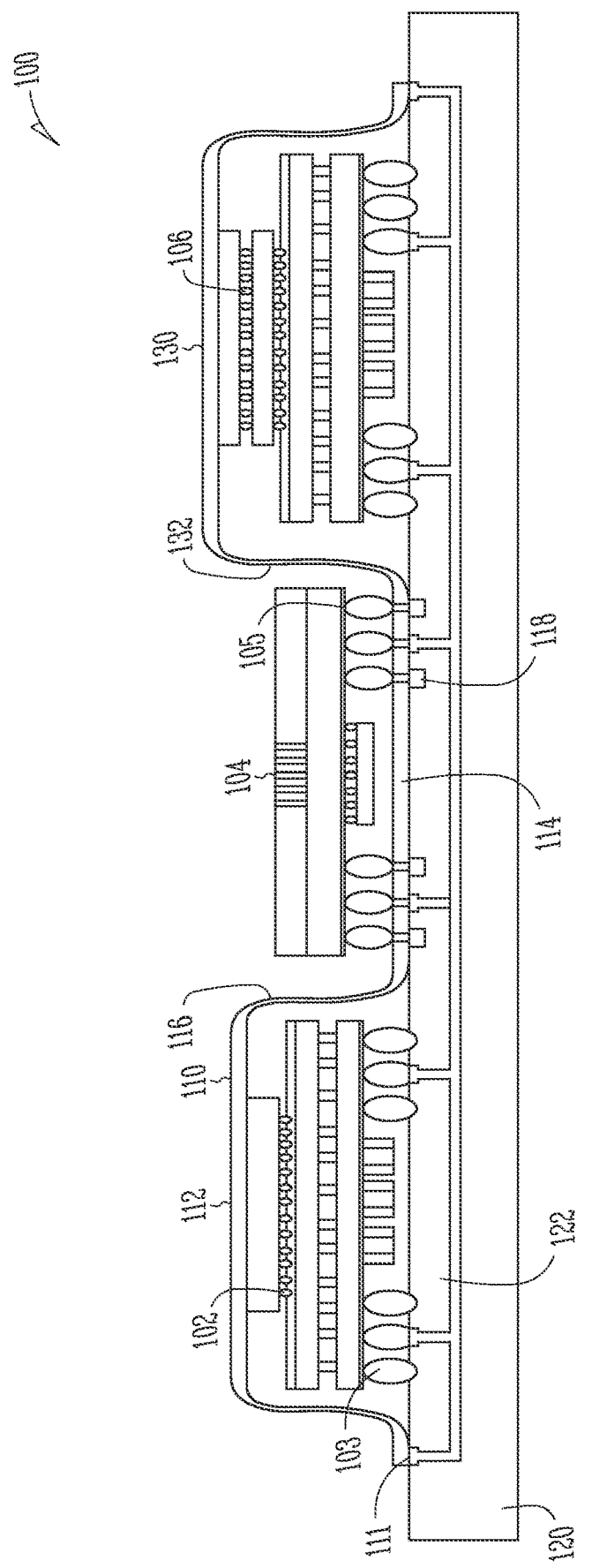
FIG. 1A shows a side view of an electronic device in accordance with some example embodiments.

FIG. 1A shows an electronic device 100 according to one example. The electronic device 100 includes a first device 102 and a second device 104 coupled to a surface of a substrate 120. A continuous flexible shield 110 is shown woven over the first device 102 and under the second device 104 to separate the first device 102 from the second device 104.

The continuous flexible shield 110 is shown having a first part 112 located over the first device 102. The continuous flexible shield 110 further includes a second part 114 located below the second device 104. A transition part 116 is shown between the first part 112 and the second part 114. Because of the woven pattern shown, the transition part 116 is located between the first device 102 and the second device 104. The transition part 116 serves as an electromagnetic shield between the first device 102 and the second device 104, and improves performance of the electronic device 100.

In selected embodiments, additional devices may also be included, and shielded using the continuous flexible shield 110. For example, FIG. 1 further shows a third device 106. The continuous flexible shield 110 is woven back over the third device 106, after passing under the second device 104. A third part 130 is coupled to the second part 114 by a second transition part 132. Because the continuous flexible shield 110 is "continuous" it may be formed from a single sheet. This makes the continuous flexible shield 110 inexpensive to manufacture, and easy to assemble on the electronic device 100.

Although three devices (102, 104, 106) are used in the example of FIG. 1, the invention is not so limited. Any numbers of devices may be separated by a continuous flexible shield in other examples. In one example, one or more of the devices being separated may include a processor die. In one example, one or more of the devices being separated may include a memory die. In one example, one or more of the devices being separated may include a system on a chip (SOC). In one example, one or more of the devices being separated may include a transmitter or receiver chip (RFIC, or the like), including, but not limited to, WiFi, Bluetooth, etc. Other frequencies apart from radio frequency are within the scope of the invention. In one example, one or more of the devices being separated may include a socket, including, but not limited to, a USB standard socket, a Thunderbolt socket, etc.

In one example, the continuous flexible shield 110 may be coupled to around. In the example of FIG. 1A, at least one end 111 is coupled to circuitry 122 in the substrate 120. The coupling at the end 111 may couple to ground, or another electrical potential that is used for electrical shielding. In one example, the continuous flexible shield 110 may include additional couplings to ground, for example along the second part 114, where the continuous flexible shield 110 passes adjacent to exposed circuitry 122 on the substrate 120. These types of example connections will be described in more detail below.

The devices 102, 104, 106 are shown coupled to the substrate 120 through connections 103 such as solder connections. In the example shown, the second device 104 includes connections 105 that pass through the continuous flexible shield 110 through one or more openings 118 in the continuous flexible shield 110. In one example, one or more openings 118 in the continuous flexible shield 110 are electrically isolated from the continuous flexible shield 110. In one example, one or more openings 118 in the continuous flexible shield 110 are electrically coupled to the continuous flexible shield 110. In one example, some openings 118 in the continuous flexible shield 110 are electrically isolated from the continuous flexible shield 110, while other openings 118 are electrically coupled to the continuous flexible shield 110.

Figure 1B:
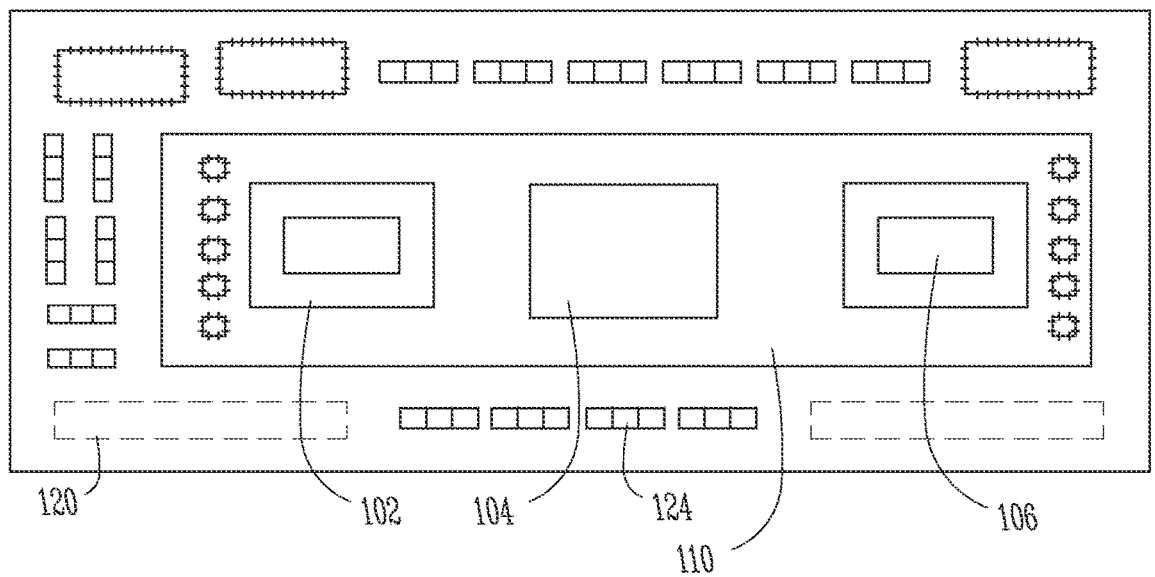
FIG. 1B shows a top view of the electronic device from FIG. 1A in accordance with some example embodiments.

FIG. 1B shows a top view of the electronic component from FIG. 1A. The first device 102, second device 104, and third device 106 are shown, with the continuous flexible shield 110 woven amongst the devices 102, 104, 106 and separating them. As shown in FIG. 1B, in one example, the continuous flexible shield 110 may not cover all surface area of substrate 120. FIG. 1B shows additional electronic components 124 that may be located outside a footprint of the continuous flexible shield 110.

In the examples shown in FIGS. 1A and 1B, the substrate 120 is a printed circuit board, such as a mother board, although the invention is not so limited. Any suitable substrate may be coupled to a continuous flexible shield to provide shielding performance enhancement. In one example, the substrate includes an interposer. In one example, the substrate includes a package substrate on which silicon is directly mounted. In one example, the substrate includes a silicon substrate.

Figure 2:
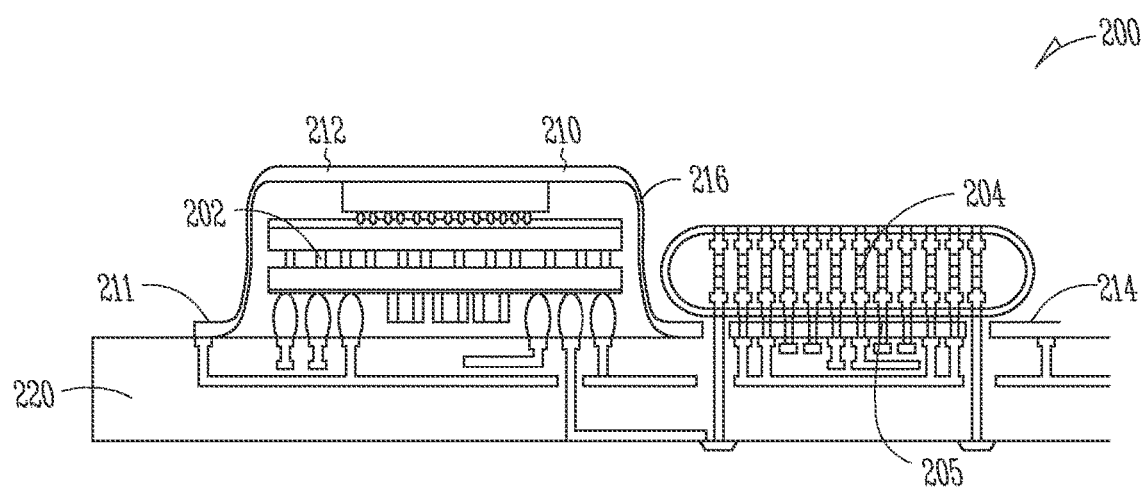
FIG. 2 shows a side view of an electronic device in accordance with some example embodiments.

FIGS. 1A and 1B show devices 102, 104, 106 that may include one or more semiconductor chips, however the invention is not so limited. FIG. 2 shows an example electronic device 200, including a first device 202 and a second device 204 coupled to a surface of a substrate 220. A continuous flexible shield 210 is shown woven over the first device 202 and under the second device 204 to separate the first device 202 from the second device 204.

Similar to the continuous flexible shield 110 described above, the continuous flexible shield 210 is shown having a first part 212 located over the first device 202. The continuous flexible shield 210 further includes a second part 214 located below the second device 204. A transition part 216 is shown between the first part 212 and the second part 214. The transition part 216 serves as an electromagnetic shield between the first device 202 and the second device 204.

In the example of FIG. 2, the second device 204 includes a socket. In the example shown in FIG. 2, the socket is a USB Type-C configuration, however, the invention is not so limited. Any other USB configuration (mini, micro, Type-A, Type-B, etc.) may also be used in selected examples. Other socket configurations such as Thunderbolt, etc. may also be used. Similar to the example of FIGS. 1A and 1B, the second device 204 may be coupled to the substrate 220 through vias 205 that pass through the continuous flexible shield 210. A conductive portion of the continuous flexible shield 210 may be coupled to a reference voltage in the substrate 220 (such as ground) through one or more connection points 211.

Figure 3A:
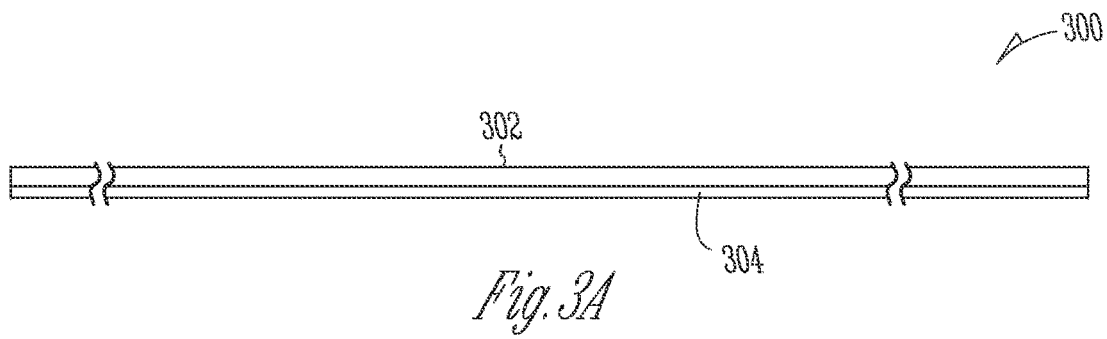
FIG. 3A-3E shows a series of continuous flexible shields in selected stages of manufacture in accordance with some example embodiments.

FIGS. 3A-3E show selected stages of manufacture of a continuous flexible shield according to an example of the invention. In FIG. 3A, a laminate base material 300 is shown. In one example, the laminate base material 300 includes a conductor layer 304 and at least one dielectric layer. In the example of FIG. 3A, the conductor layer 304 is disposed on a first dielectric layer 302 and a. In one example, the conductor layer 304 includes copper, however other metals such as aluminum, or other alloys, etc. are within the scope of the invention. In one example, the dielectric layer 302 includes polyimide, although the invention is not so limited.

Figure 3B:
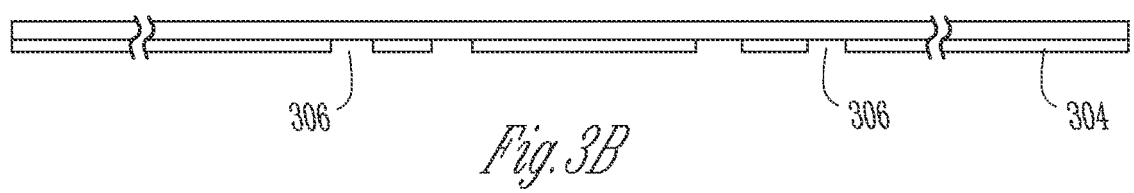

In FIG. 3B, one or more conductor openings 306 are formed by removing a portion of the conductive layer 304. In one example, a process such as etching may be used to form the conductor openings 306. Other processes may include laser ablation, or mechanical removal such as drilling, etc.

Figure 3C:
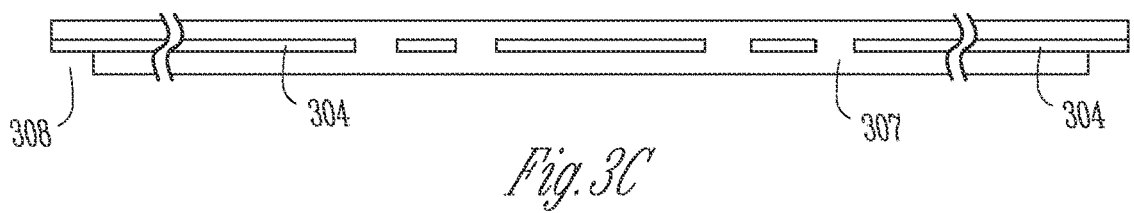

In FIG. 3C, one or more terminal pads 308 are formed by removing a portion of a second dielectric layer 307 and exposing the conductor layer 304. In one example, a process such as hot-press bonding may be used to attach the second dielectric layer 307 onto the conductor layer 304 and the one or more conductor openings 306. In one example, a process such as etching may be used to form the terminal pads 308. Other processes may include laser ablation, or mechanical removal, etc.

Figure 3D:
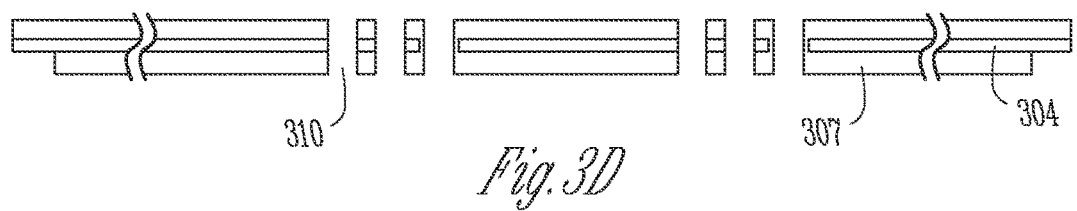

In FIG. 3D, one or more openings 310 are formed through the laminate base material 300. In one example, one or more openings 310 are formed through the second dielectric layer 307, where a portion of the second dielectric layer 307 remains between the conductor layer 304 and the one or more openings 310. In one example, one or more openings 310 are formed through the conductor layer 304, where a portion of the conductor layer 304 is exposed on the side wall of the one or more openings 310. In one example, the openings 310 may be laser drilled. Other examples include, but are not limited to, mechanical drilling, etching, etc.

Figure 3E:
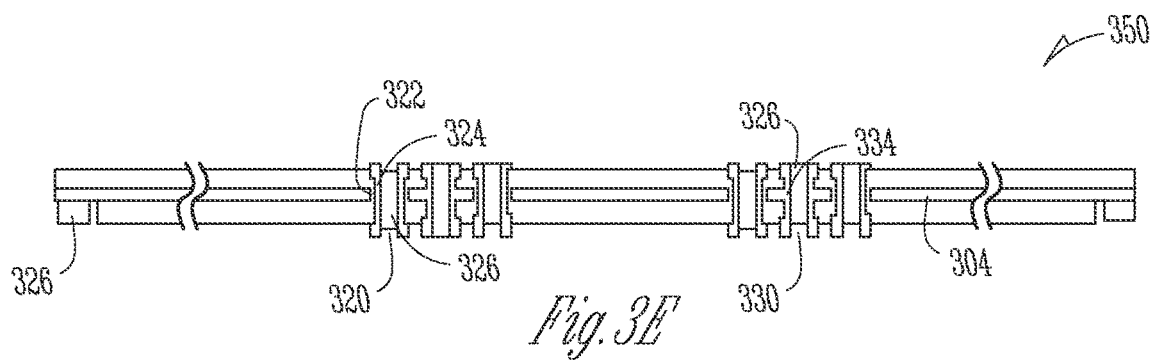

In FIG. 3E, one or more vias are formed within the one or more openings 310 to form a completed continuous flexible shield 350. In FIG. 3E, an example electrically isolated via 320 is shown, and an example electrically coupled via 330 is shown. In forming the electrically isolated via 320, a conductor 324 is formed within the opening 310, and over an internal dielectric layer 322 that isolates the conductor 324 from the conductor layer 304. Because of the presence of the internal dielectric layer 322, the conductor 324 will transmit electrical signals through the opening 310 in the laminate base material 300, but will not be affected by the conductor layer 304.

In one example, the conductor 324 includes a hollow cylinder, as shown in FIG. 3E. In one example the hollow cylinder conductor 324 is formed by plating the opening 310, for example electrolytic plating, or electroless plating. In one example, a hollow cylinder conductor 324 is filled with solder 326. In later assembly in an electronic device as shown in examples above, the presence of pre-loaded solder 326 in hollow cylinder conductors 324 facilitates easy assembly. In selected examples, solder 326 may also be deposited on the terminal pads 308 as shown.

The electrically coupled via 330 may be formed concurrently with the electrically isolated via 320 in some examples. In FIG. 3E, the electrically coupled via 330 also includes a conductor 334. Similar to conductor 324, in one example, the conductor 334 includes a hollow cylinder. In one example the hollow cylinder conductor 334 is formed by plating the opening 310, for example electrolytic plating, or electroless plating. In one example the electrically coupled via 330 does not include the internal dielectric layer 322 that is present in the electrically isolated via 320. As a result, the hollow cylinder conductor 334 is formed in direct contact with the conductor layer 304. The conductor layer 304 coupled to a reference voltage e.g., a ground (Vss) reference voltage through the hollow cylinder conductor 334. Alternatively, the conductor layer 304 can also be associated to a reference voltage e.g., a ground (Vss) reference voltage through the terminal pads 308.

In one example, one or more terminal pads 308 are coupled to a ground source in a device system e.g., a motherboard (not shown) through a substrate such as substrate 120, 220 as described above. In one example, one or more electrically coupled vias 330 are coupled to a ground source in a device system e.g., a motherboard (not shown) through a substrate such as substrate 120, 220 as described above. When coupling a device, such as devices 102, 104, 106, 202, 204 through a continuous flexible shield, either an electrically coupled via 330 or an electrically isolated via 320 may be used. If a particular contact in a device is to be coupled to ground, it may be coupled using an electrically coupled via 330. If a particular contact e.g., a signal or a power interconnect in a device is to be isolated from ground voltage, it may be coupled through the continuous flexible shield, using an electrically isolated via 320.

Figure 4:
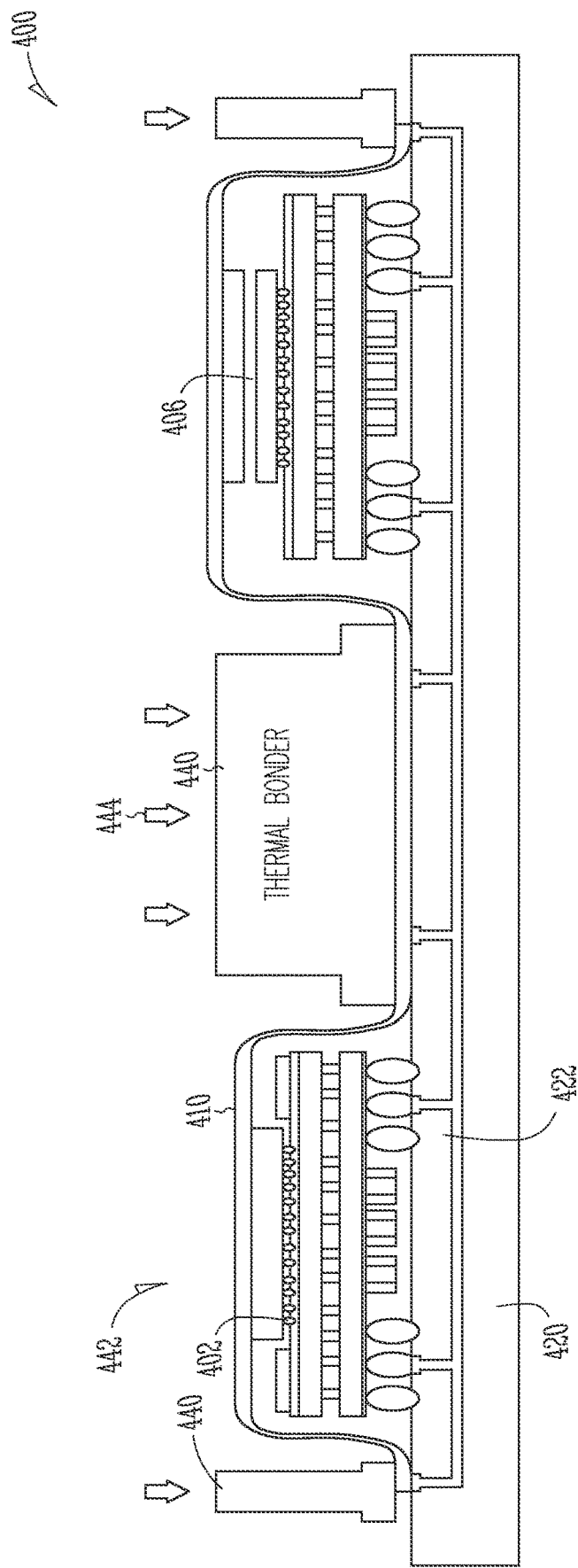
FIG. 4 shows a side view of an electronic device a stage of manufacture in accordance with some example embodiments.

FIG. 4 shows an example of an assembly process attaching a continuous flexible shield 410, similar to continuous flexible shield 350 or other continuous flexible shields as described in examples above. A first device 402 and a second device 406 are shown coupled to a substrate 420. The substrate 420 includes internal circuitry 422, such as various voltage traces, routing traces, and ground traces. The continuous flexible shield 410 is flexed into the weaving shape shown in FIG. 4, and a thermal compression bonding head 440 is pressed over the substrate 420. In the example shown, openings 442 are included in the thermal compression bonding head 440 to leave space for the devices 402, 406. Pressure and heat, as indicated by arrows 444 are applied through the thermal compression bonding head 440 that melt solder, such as pre-applied solder 326 from example continuous flexible shield 350. Although a thermal compression bonding solution as shown in FIG. 4 is easily adapted to manufacture of electronic devices using a continuous flexible shield, the invention is not so limited. Other methods of manufacture may be used, such as oven heating, local heating, non-solder attachment options, etc.

Figure 5:
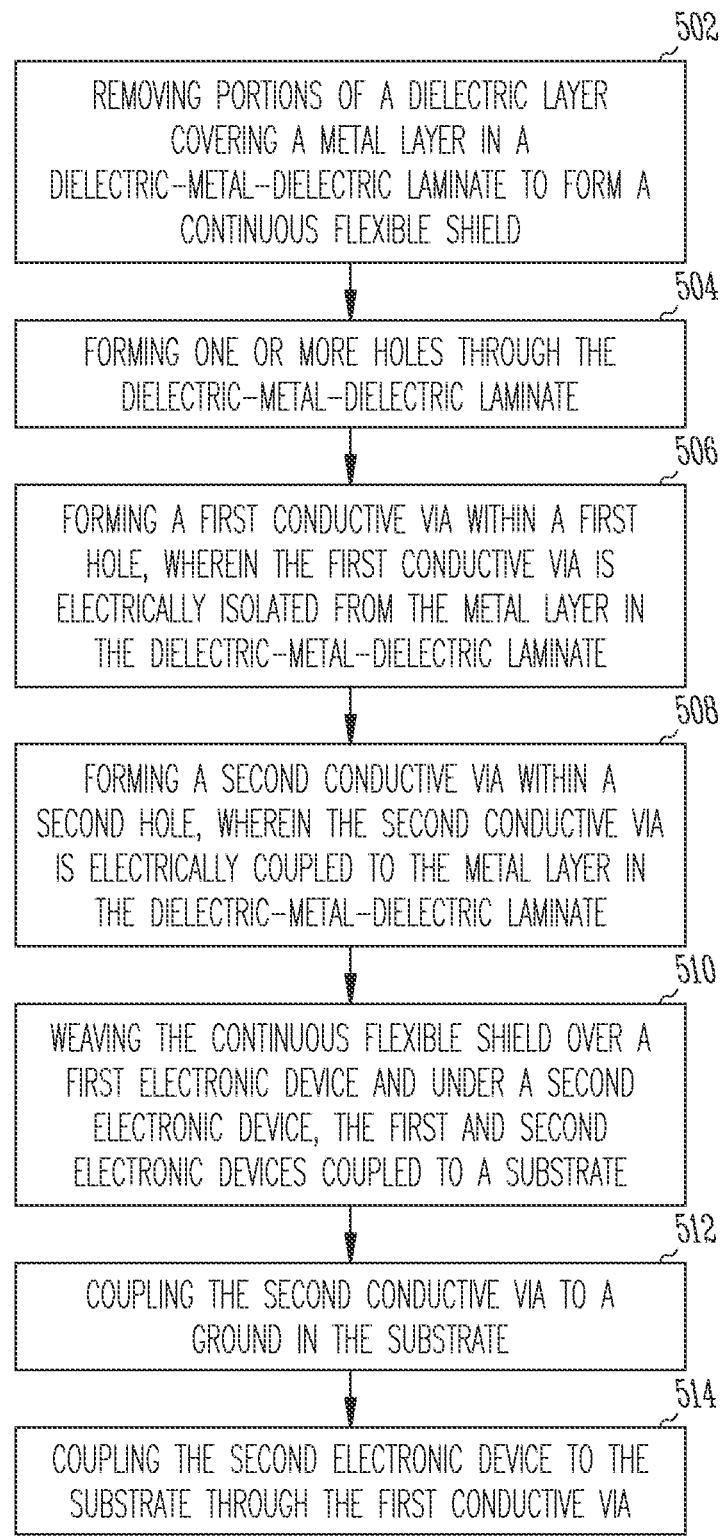
FIG. 5 shows a flow diagram of a method of manufacture of electronic devices in accordance with some example embodiments.

FIG. 5 shows a flow diagram of a method according to one example. In operation 502, a continuous flexible shield forming operation includes removing portions of a dielectric layer covering a metal layer in a dielectric-metal-dielectric laminate. In operation 504, one or more holes are formed through the dielectric-metal-dielectric laminate. In operation 506, a first conductive via is formed within a first hole, wherein the first conductive via is electrically isolated from the metal layer in the dielectric-metal-dielectric laminate. In operation 508, a second conductive via is formed within a second hole, wherein the second conductive via is electrically coupled to the metal layer in the dielectric-metal-dielectric laminate. In operation 510, the continuous flexible shield is woven over a first electronic device and under a second electronic device, the first and second electronic devices coupled to a substrate.

Although the term woven is used to describe a final arrangement of components, it is not necessary that all components are in place before the continuous flexible shield is attached. In one example a first electronic device is in place, then the continuous flexible shield is attached, then a second electronic device is installed over a portion of the continuous flexible shield, and is coupled through the portion of the continuous flexible shield as described in examples above.

In operation 512, the second conductive via is coupled to a ground in the substrate, and in operation 514, the second electronic device is coupled to the substrate through the first conductive via.

Figure 6:
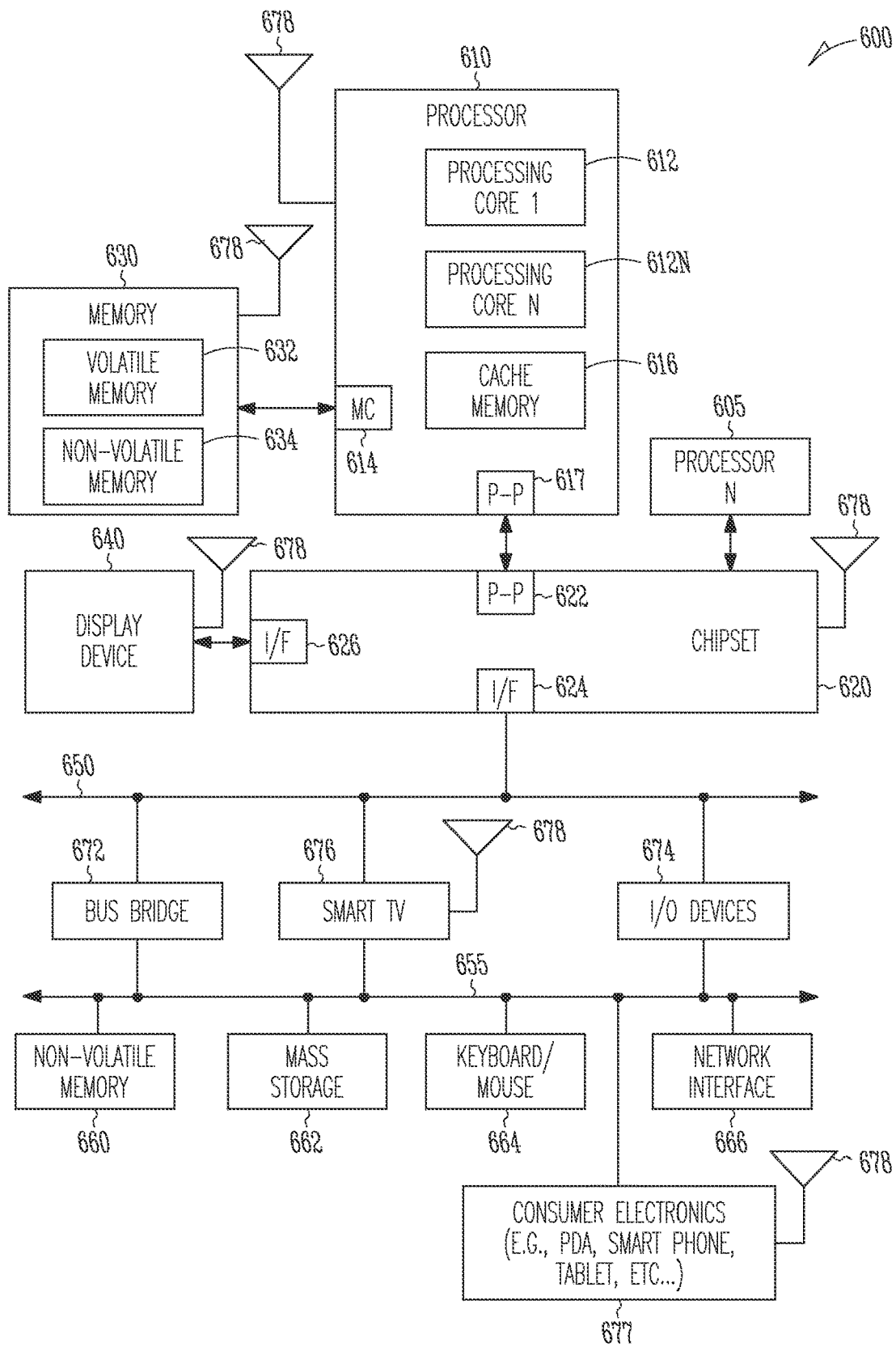
FIG. 6 shows a system that may incorporate continuous flexible shields and methods, in accordance with some example embodiments.

FIG. 6 illustrates a system level diagram, depicting an example of an electronic device (e.g., system) that may include a continuous flexible shield and/or methods described above. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 includes a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals. In one example, any combination of components in a chipset may be separated by a continuous flexible shield as described in the present disclosure.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the method and apparatuses disclosed herein, a non-limiting list of embodiments is provided here:

Example 1 includes an electronic device. The electronic device includes a first device and a second device coupled to a surface of a substrate, and a continuous flexible shield woven over the first device and under the second device to separate the first device from the second device. The continuous flexible shield is electrically coupled to a ground source in the substrate.

Example 2 includes the electronic device of example 1, wherein the second device is coupled to the substrate through one or more openings in the continuous flexible shield.

Example 3 includes the electronic device of any one of examples 1-2, wherein the continuous flexible shield includes a laminate of at least one layer of metal foil and at least one layer of polymer.

Example 4 includes the electronic device of any one of examples 1-3, wherein the continuous flexible shield includes one or more integral vias.

Example 5 includes the electronic device of any one of examples 1-4, wherein the substrate includes a package substrate coupled to a die.

Example 6 includes the electronic device of any one of examples 1-5, wherein the substrate includes a printed circuit board.

Example 7 includes the electronic device of any one of examples 1-6, wherein the substrate includes a silicon substrate.

Example 8 includes the electronic device of any one of examples 1-7, wherein the first device includes a semiconductor die.

Example 9 includes the electronic device of any one of examples 1-8, wherein the second device includes a radio frequency device.

Example 10 includes the electronic device of any one of examples 1-9, wherein the second device includes a socket.

Example 11 includes an electronic device. The electronic device includes a first device and a second device coupled to a surface of a substrate, and a continuous flexible shield woven over the first device and under the second device to separate the first device from the second device, wherein the continuous flexible shield is electrically coupled to a ground source in the substrate, and wherein the second device is coupled to the substrate through one or more vias passing through the continuous flexible shield.

Example 12 includes the electronic device of example 11, wherein the one or more vias includes at least one via electrically isolated from the continuous flexible shield and at least one via electrically coupled to the continuous flexible shield.

Example 13 includes the electronic device of any one of examples 11-12, further including a third device coupled to the surface of the substrate, wherein the continuous flexible shield is woven over the third device.

Example 14 includes the electronic device of any one of examples 11-13, wherein the second device is a USB Type C socket.

Example 15 includes the electronic device of any one of examples 11-14, wherein the continuous flexible shield includes a laminate of a layer of copper foil sandwiched between layers of polyimide.

Example 16 includes the electronic device of any one of examples 11-15, wherein the one or more vias includes at least one hollow cylinder passing through the continuous flexible shield.

Example 17 includes the electronic device of any one of examples 11-16, wherein the one or more vias includes solder within a center of the at least one hollow cylinder.

Example 18 includes a method of forming an electronic device. The method includes forming a continuous flexible shield, including removing portions of a dielectric layer covering a metal layer in a dielectric-metal-dielectric laminate, forming one or more holes through the dielectric-metal-dielectric laminate forming a first conductive via within a first hole, wherein the first conductive via is electrically isolated from the metal layer in the dielectric-metal-dielectric laminate, and forming a second conductive via within a second hole, wherein the second conductive via is electrically coupled to the metal layer in the dielectric-metal-dielectric laminate. The method includes weaving the continuous flexible shield over a first electronic device and under a second electronic device, the first and second electronic devices coupled to a substrate, coupling the second conductive via to a ground in the substrate, and coupling the second electronic device to the substrate through the first conductive via.

Example 19 includes the method of example 18, wherein forming one or more holes through the dielectric-metal-dielectric laminate includes laser drilling.

Example 20 includes the method of any one of examples 18-19, wherein forming a first conductive via within a first hole includes electroplating to form a hollow conductive cylinder.

Example 21 includes the method of any one of examples 18-20, further including thermal compression bonding the continuous flexible shield to the substrate at selected locations.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. An electronic device, comprising:
   a first device and a second device coupled to a surface of a substrate, wherein the first device includes a semiconductor die;
   a continuous flexible shield woven over the first device and under the second device to separate the first device from the second device;
   wherein the continuous flexible shield is electrically coupled to a ground source in the substrate, and wherein the second device is coupled to the substrate through one or more openings in the continuous flexible shield.

2. The electronic device of claim 1, wherein the continuous flexible shield includes a laminate of at least one layer of metal foil and at least one layer of polymer.

3. The electronic device of claim 1, wherein the continuous flexible shield includes one or more integral vias.

4. The electronic device of claim 1, wherein the substrate includes a package substrate coupled to a die.

5. The electronic device of claim 1, wherein the substrate includes a printed circuit board.

6. The electronic device of claim 1, wherein the substrate includes a silicon substrate.

7. The electronic device of claim 1, wherein the second device includes a radio frequency device.

8. The electronic device of claim 1, wherein the second device includes a socket.

9. An electronic device, comprising:
   a first device and a second device coupled to a surface of a substrate;
   a continuous flexible shield woven over the first device and under the second device to separate the first device from the second device;
   wherein the continuous flexible shield is electrically coupled to a ground source in the substrate; and
   wherein the second device is coupled to the substrate through one or more vias passing through the continuous flexible shield.

10. The electronic device of claim 9, wherein the one or more vias includes at least one via electrically isolated from the continuous flexible shield and at least one via electrically coupled to the continuous flexible shield.

11. The electronic device of claim 9, further including a third device coupled to the surface of the substrate, wherein the continuous flexible shield is woven over the third device.

12. The electronic device of claim 9, wherein the second device is a USB Type C socket.

13. The electronic device of claim 9, wherein the continuous flexible shield includes a laminate of a layer of copper foil sandwiched between layers of polyimide.

14. The electronic device of claim 9, wherein the one or more vias includes at least one hollow cylinder passing through the continuous flexible shield.

15. The electronic device of claim 14, wherein the one or more vias includes solder within a center of the at least one hollow cylinder.

\* \* \* \* \*